United States Patent [19]

Furumochi

[11] Patent Number: 5,473,277
[45] Date of Patent: Dec. 5, 1995

[54] OUTPUT CIRCUIT FOR PROVIDING A FINALLY ADJUSTABLE VOLTAGE

[75] Inventor: Kazuto Furumochi, Nakahara, Japan

[73] Assignee: Fujitsu Limited, Kawasaki, Japan

[21] Appl. No.: 222,943

[22] Filed: Apr. 5, 1994

[30] Foreign Application Priority Data

May 13, 1993 [JP] Japan .................................. 5-111748

[51] Int. Cl.$^6$ ........................................................ G05F 1/10
[52] U.S. Cl. ........................ 327/543; 327/538; 327/537; 365/189.09
[58] Field of Search .................................... 327/362, 538, 327/543, 401, 378, 535, 537, 534; 365/189.09

[56] References Cited

U.S. PATENT DOCUMENTS

| | | | |
|---|---|---|---|
| 4,899,309 | 2/1990 | Kitazawa et al. | 365/189.09 |
| 5,031,148 | 7/1991 | Kitazawa et al. | 365/189.09 |
| 5,099,146 | 3/1992 | Miki et al. | 327/537 |

Primary Examiner—Timothy P. Callahan
Assistant Examiner—Jung Ho Kim
Attorney, Agent, or Firm—Nikaido, Marmelstein, Murray & Oram

[57] ABSTRACT

A constant voltage generator circuit comprises adjusting means for making fine adjustment of each back-gate voltage of transistors on the basis of external control signals, and a transistor circuit for outputting a constant voltage adjusted on the basis of the back-gate voltage. A constant voltage generator circuit comprises adjusting means for making fine adjustment of each back-gate voltage of transistors on the basis of external control signals; and a transistor circuit for outputting a constant voltage adjusted on the basis of the back-gate voltages, the transistor circuit including a plurality of N transistors with their respective gates and sources connected together, and a load element for dividing the power source voltage with a plurality of N transistors. Adjusting means comprises a plurality of N-1 switching circuits for supplying bias voltages individually to the back-gate of the first through (N-1)th transistors in the transistor circuit on the basis of the external control signal, and a switching element for stopping the operation of the Nth transistor in the transistor circuit on the basis of the external control signal. A semiconductor memory comprises memory means for storing information; and constant voltage generating means for supplying voltage to memory means, the constant voltage generating means including adjusting means for making fine adjustment of each back-gate voltage of a plurality of transistor on the basis of external control signals, and a transistor circuit for outputting the constant voltage adjusted on the basis of the back-gate voltages.

12 Claims, 10 Drawing Sheets

OUTPUT CIRCUIT FOR PROVIDING A FINALLY ADJUSTABLE VOLTAGE

BACKGROUND OF THE INVENTION

1. Field of the Invention

The invention relates to a constant-voltage generator circuit and semiconductor memory, and more particularly, to the improvements of a circuit for generating a fine-adjusted constant voltage and low-voltage-driven memory.

2. Description of the Related Art

Recently, pattern microminiaturization is making a rapid progress in large scale integrated circuit (hereinafter referred to as "LSI") devices because of the needs for the smaller size and higher capacity, and the higher speed of transistor operation. This, in turn, reduces the resisting voltage of MOS transistors. As for semiconductor memory for storing information, for example, designers strive to reduce its driving voltage.

In order to supply high precision constant voltages to the low-voltage-driven semiconductor memory, designers usually use constant voltage generator circuits using a band gap or constant voltage generator circuits using the threshold voltage of field effect transistors.

However, adjusting steps of the constant voltage are limited to the selection ranges which depend on the thresholds of diode-configured transistors of a constant voltage circuit. Accordingly, the voltage adjustment fineness may become "rough" and a fine adjustment of the power supply voltage may need to be done for each load circuit because the thresholds vary with unevenness in transistor manufacturing.

Here, related arts of the invention will be explained. For example, as shown in FIG. 1 a first constant voltage generator circuit supplying a constant voltage $V_{DD}$ to SRAM (static random access memory) comprises a transistor selection circuit 1, a load resistor RL1, and four transistors T11–T41. Note that the circuit is arranged in a manner where the back-gates BG1–BG4 of the four transistor T11–T41 are biased with a common voltage.

Specifically, the four transistors T11–T41 are composed of n-type field effect transistors, each of which is diode-configured. The four transistors T11–T41 are serially connected with the drain of transistor T11 connected to one end of a load resistor RL1 and connected to an output OUT. The other end of the load resistor RL1 is connected to the power source line $V_{CC}$ and the source of the transistor T41 is connected to the ground line $V_{SS}$. The back-gates BG1–BG4 of the four transistors T11–T41 are connected together to the ground line $V_{SS}$. And, each of source-drain connection points of the transistors T11–T41 is connected to a transistor selection circuit 1.

The transistor selection circuit 1 comprises three switching devices TS1–TS3, the connections of which are controlled on the basis of external control signal S. The switching device TS1 is connected between the source-drain connection points of the transistors T11 and T21 and the transistors T21 and T31. The switching device TS2 is connected between the source-drain connection points of the transistors T21 and T31 and the transistors T31 and T41. The switching device TS3 is connected between the source-drain connection point of the transistors T31 and T41 and the ground line $V_{SS}$.

The above-described constant voltage generator circuit functions as follows: when switching devices TS1–TS3 are selected and connected on the basis of an external control signal S, diode-configured transistors T21–T41 are selected; this causes the voltage between the power source line Vcc and the ground line $V_{SS}$ to be divided by the load resistor RL1 and the serially connected transistors T11–T41, where each resistance of the transistors T11–T41 in the conducting (or ON) state exhibits a value which depends on the substantially constant threshold VTH; and a constant voltage VDD is generated at the output OUT.

Further, a second constant voltage generator circuit according to related arts of the present invention comprises a transistor selection circuit 2, a load resistor RL2, and four transistors T12–T42 as shown in FIG. 2. In this circuit, the back-gates of the four transistors T12–T42 are biased with different voltages.

As in the first constant voltage generator circuit, the four transistors T12–T42, each of which is in a diode configuration, are connected in a series. The drain of transistor T12 is connected to one end of the load resistor RL2 and the output OUT. The other end of the load resistor RL2 is connected to the power source line $V_{CC}$ and the source of the transistor T42 is connected to the ground line VSS.

The back-gate BG1 of the transistor T12 is connected to the source-drain connection point of the transistors T12 and T22, the back-gate BG2 of the transistor T22 is connected to the source-drain connection point of the transistors T22 and T32, the back-gate BG3 of the transistor T32 is connected to the source-drain connection point of the transistors T32 and T42. And the back-gate BG4 of the transistor T42 is connected to the ground line $V_{SS}$.

The transistor selection circuit 2 comprises three switching devices TS1–TS3 and their connections are controlled on the basis of an external control signal S. The switching device TS1 is connected between the source-drain connection points of the transistors T12 and T22 and the transistors T22 and T32. The switching device TS2 is connected between the source-drain connection points of the transistors T22 and T32 and the transistors T32 and T42. The switching device TS3 is connected between the source-drain connection point of the transistors T32 and T42 and the ground line $V_{SS}$.

The constant voltage generator circuit functions as follows: when switching devices TS1–TS3 are selected and connected on the basis of an external control signal S, diode-configured transistors T21–T41 are selected; this causes the voltage between the power source line $V_{CC}$ and the ground line $V_{SS}$ to be divided by the load resistor RL2 and the transistors T12–T42, where each resistance of the transistors T11–T41 in the conducting state exhibits a value which depends on a different threshold VTH; and a constant voltage VDD is generated at the output OUT.

SUMMARY OF THE INVENTION

The object of the present invention is to provide an extremely fine voltage adjustment by forming a simple circuit where thresholds of transistors are made use of and by devising a new way of biasing back-gates. In other words, it is to generate constant voltages in fine steps by dividing the power source voltage by the resistance in the conducting state which depends on the thresholds of n transistors and a load resistor connected to the power source line.

The further object of the invention is to enhance the reliability of a circuit where an inventive constant voltage generator circuit is applied by providing a ROM fuse circuit, programming the fuse devices to generate an external control signal, and vary finely adjusting the bias voltages of back-gates in the constant voltage generator circuit according to the external control signal.

That is, a preferred embodiment of the constant voltage generator circuit according to the present invention, comprising adjusting means for making fine adjustment of each back-gate voltage of transistors on the basis of external control signals, and a transistor circuit for outputting a constant voltage adjusted on the basis of the back-gate voltage.

A constant voltage generator circuit comprises adjusting means for making fine adjustment of each back-gate voltage of transistors on the basis of external control signals; and a transistor circuit for outputting a constant voltage adjusted on the basis of the back-gate voltages, the transistor circuit includes a plurality of N transistors with their respective gates and drains connected together, and a load element for dividing the power source voltage with a plurality of N transistors.

A constant voltage generator circuit comprises a transistor circuit for outputting a constant voltage adjusted on the basis of back-gate voltages, the transistor circuit includes a plurality of N transistors with their respective gates and drains connected together, and a load element for dividing the power source voltage with a plurality of N transistors; a ROM fuse circuit for generating the external control signals; and adjusting means for making fine adjustment of each back-gate voltage of a plurality of transistors on the basis of the external control signals.

Adjusting means comprises a plurality of N−1 switching circuits for supplying bias voltages individually to the back-gate of the first through (N−1)th transistors in the transistor circuit on the basis of the external control signal, and a switching element for stopping the operation of the Nth transistor in the transistor circuit on the basis of the external control signal.

The first switching circuit of the adjusting means, on the basis of the external control signal, is for biasing the back-gate of the first transistor in the transistor circuit with an selected one out of the source voltage between the first and second serially-connected transistors, the source voltage between the second and third transistors, . . . , the source voltage between the (N−1)th and Nth transistors, and the power source voltage of the lower side.

The second switching circuit of the adjusting means, on the basis of the external control signal, is for biasing the back-gate of the second transistor in the transistor circuit with an selected one out of the source voltage between the second and third serially-connected transistors, the source voltage between the third and forth transistors, . . . , the source voltage between the (N−1)th and (n)th transistors, and the power source voltage of the lower side.

The (N−1)th switching circuit of the adjusting means, on the basis of the external control signal, for biasing the back-gate of the (N−1)th transistor in the transistor circuit with an selected one out of the source voltage between the (N−1)th and Nth serially-connected transistors, and the power source voltage of the lower side.

External control signals are generated by programming the fuse elements of the ROM fuse circuit. The transistor circuit is formed of n-type field effect transistors.

A semiconductor memory comprises memory means for storing information, and constant voltage generating means for supplying voltage to memory means. The constant voltage generating means includes adjusting means for making fine adjustment of each back-gate voltage of a plurality of transistor on the basis of external control signals, and a transistor circuit for outputting the constant voltage adjusted on the basis of the back-gate voltages.

The transistor circuit includes a plurality of N transistors with their respective gates and drains connected together, and a load element for dividing the power source voltage with a plurality of N transistors. The constant voltage generating means further comprises a ROM fuse circuit for generating the external control signals.

Employing such circuit configurations yields a constant voltage generating circuit permitting voltage adjustment by a fine step and low-voltage-driven reliable semiconductor memory to which the constant voltage generating circuit is applied.

BRIEF DESCRIPTION OF THE DRAWINGS

FIG. 7A shows an equivalent circuit of the constant voltage generator circuit shown in FIG. 6 when programming (C1→a, C2→e, and C3→h);

FIG. 7B shows an equivalent circuit of the constant voltage generator circuit shown in FIG. 6 when programming (C1→b, C2→e, and C3→h);

FIG. 7C shows an equivalent circuit of the constant voltage generator circuit shown in FIG. 6 when programming (C1→c, C2→e, and C3→h);

FIG. 7D shows an equivalent circuit of the constant voltage generator circuit shown in FIG. 6 when programming (C1→d, C2→e, and C3→h);

FIG. 7E shows an equivalent circuit of the constant voltage generator circuit shown in FIG. 6 when programming (C1→d, C2→f, and C3→h);

FIG. 7F shows an equivalent circuit of the constant voltage generator circuit shown in FIG. 6 when programming (C1→d, C2→g, and C3→h);

FIG. 7G shows an equivalent circuit of the constant voltage generator circuit shown in FIG. 6 when programming (C1→d, C2→g, and C3→i);

FIG. 8A shows an equivalent circuit of the constant voltage generator circuit shown in FIG. 6 when programming (C1→a, C2→e, and C3→h);

FIG. 8B shows an equivalent circuit of the constant voltage generator circuit shown in FIG. 6 when programming (C1→c, C2→e, and C3→h);

FIG. 8C shows an equivalent circuit of the constant voltage generator circuit shown in FIG. 6 when programming (C1→d, C2→e, and C3→h);

FIG. 8D shows an equivalent circuit of the constant voltage generator circuit shown in FIG. 6 when programming (C1→d, C2→g, and C3→h)

DETAILED DESCRIPTION

Figure 2:
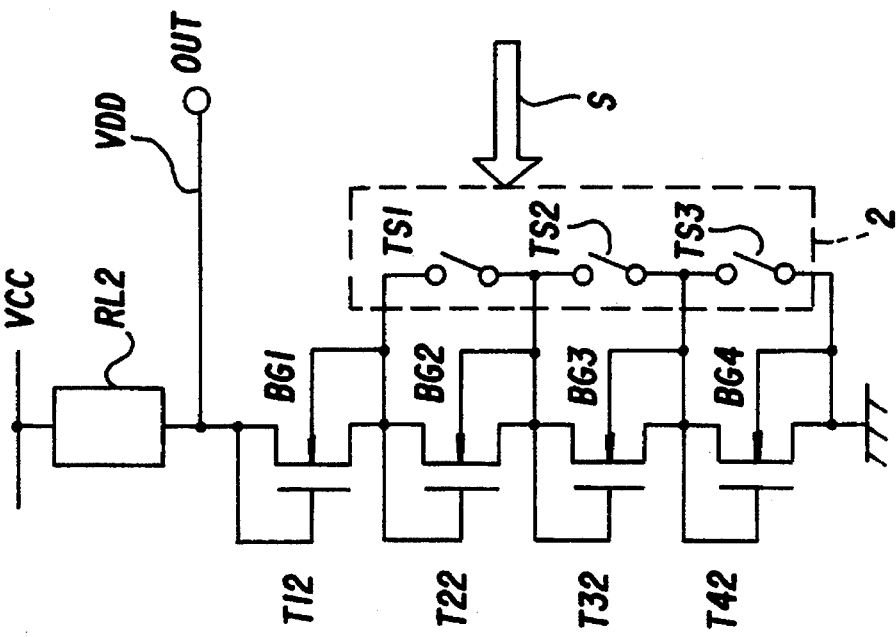
FIG. 2 is a diagram showing the arrangement of another transistor-selecting-type constant voltage generator circuit according art which is related to the invention.
Figure 1:
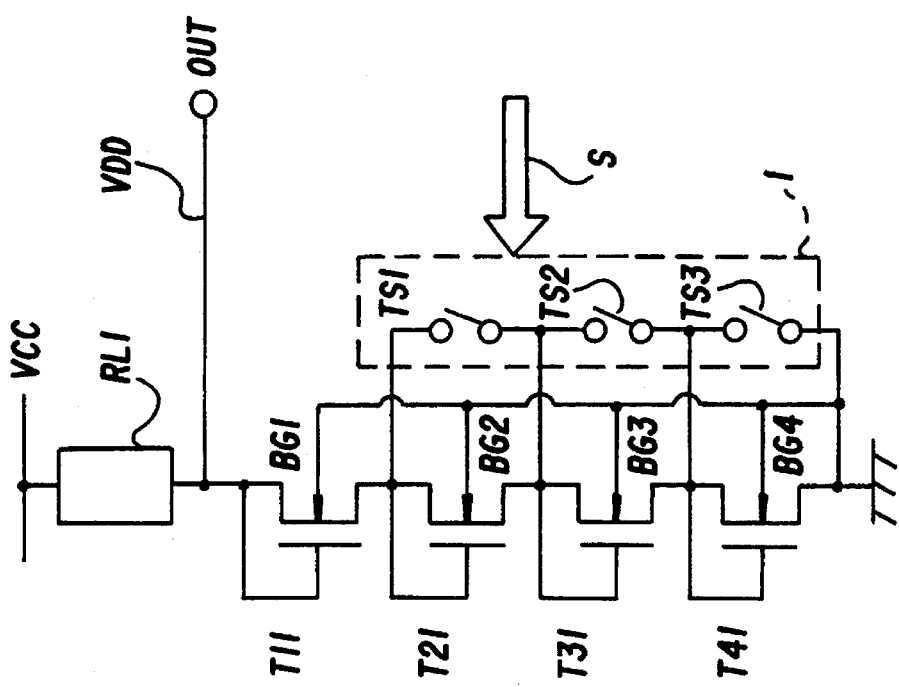
FIG. 1 is a diagram showing the arrangement of a transistor-selecting-type constant voltage generator circuit according art which is related to the present invention.

According to a first constant voltage generator circuit of related arts of the invention, as shown in FIG. 1, a transistor selection circuit 1 is provided, and some of the four transistors T11–T41 are selected on the basis of the external control signal S. Thus, through the selection of the transistors T11–T41, it is possible to obtain a constant voltage $V_{DD}$ which is the allotted portion of the voltage between the power source line $V_{CC}$ and the ground line $V_{SS}$ divided by the ON-state (or conducting-state) resistances which depend on a substantially constant threshold VTH and the load resistor RL1.

Also, according to a second constant voltage generator circuit of related arts of the invention, a transistor selection circuit 2 is provided, and some of the four transistors T12–T42 are selected on the basis of the external control signal S. Thus, through the selection of the transistors T12–T42, it is possible to obtain a constant voltage $V_{DD}$ which is the allotted portion of the voltage between the power source line $V_{CC}$ and the ground line $V_{SS}$ divided by the ON-state resistances which depend on different thresholds VTH and the load resistor RL2.

However, what is true to both first and second constant voltage generator circuit is that the adjusting steps for the constant voltage are limited within selection ranges which depend on the thresholds VTH of the diode-configured transistors T11–T41 or T12–T42, which causes its voltage adjusting fineness to be "rough". Additionally, when thresholds VTH varies owing to unevenness in manufacturing of transistors T11–T41 or T12–T42, a fine adjustment of the constant voltage $V_{DD}$ becomes necessary for every load circuit.

This prevents a high-precision constant voltage $V_{DD}$ from being supplied to minutely processed low-voltage-driven SRAM and the like. Thus, unevenness in manufacturing may result in lack of stability of circuit operation or degradation of reliability of its application system.

Figure 3:
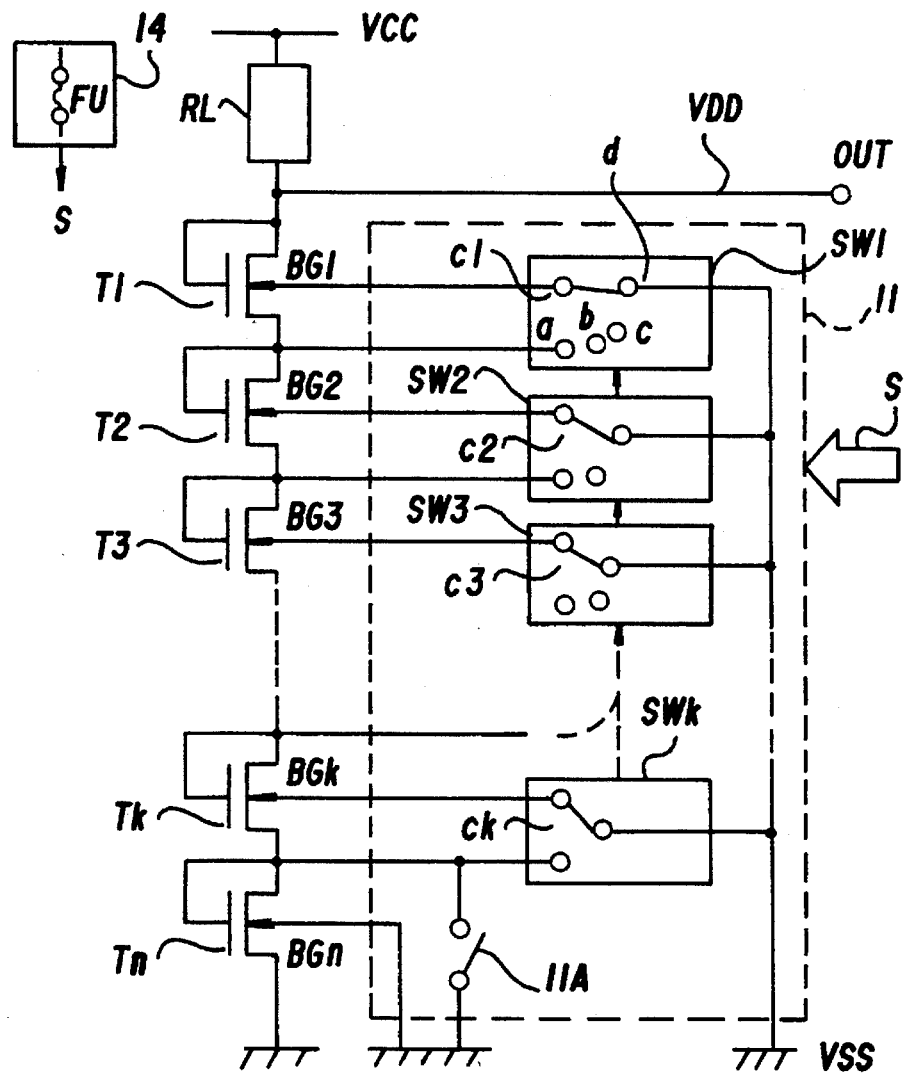
FIG. 3 is a diagram showing the arrangement of a fundamental constant voltage generator circuit according to the invention.

On the other hand, a fundamental constant voltage generator circuit of the invention, as shown in FIG. 3, is provided with a load element RL, a bias variable means 11, and a plurality of n field effect transistors Tn (n=1,2, . . . ,n). The n transistors, each of which is in a diode configuration, are connected in a series. One end (of T1) of the serially connected transistors is connected to one end of the load element RL and the output OUT. The other end of the load element RL is connected to the first power source line $V_{CC}$, and the other end (of Tn) of the serially connected transistors is connected to the second power source line $V_{SS}$. The back-gates BGn (n=1,2, . . . ,n) of the n transistors Tn are connected to the bias variable means 11, the outputs of which are controlled on the basis of the external control signal S.

Specifically, in the fundamental constant voltage generator circuit of the invention, the bias variable means 11 comprises a switching element 11A and n–1 selection switching circuits SWk (k=1,2, . . . ,n–1). The back-gate BGk of a transistor Tk is connected individually to the common contact Ck of the respective selection switching circuit Swk. The source-drain connection points between the serially connected transistors Tn are connected to contacts a, b, c, d, . . . . The back-gate Bgn of the transistor Tn connected to the second power source line $V_{SS}$ is connected to the second power source line $V_{SS}$. The switching element 11A is connected in parallel to the transistor Tn connected to the second power source line $V_{SS}$.

Further, in the fundamental constant voltage generator circuit of the invention, to the back-gates Bgn (n=1,2, . . . ,n) of the n transistors Tn, there are supplied voltages of source-drain connection points between serially connected transistors Tn or the voltage of the second power source line $V_{SS}$.

Further, in the fundamental constant voltage generator circuit of the invention, output control for the bias variable means 11 is achieved by providing a ROM fuse circuit 14 for generating the external control signal S and programming the fuse elements FU in the ROM fuse circuit 14.

Figure 4:
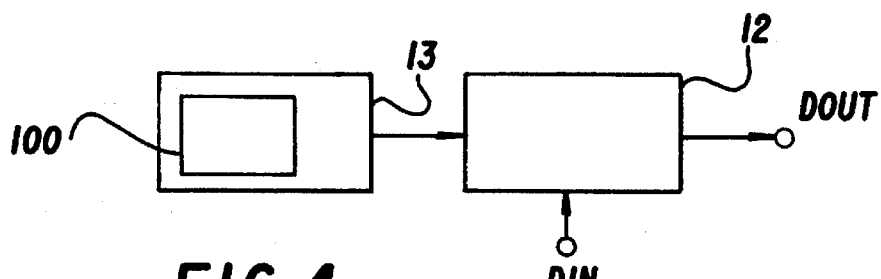
FIG. 4 is a diagram showing the fundamental arrangement of semiconductor memory to which the constant voltage generator circuit shown in FIG. 3 is applied.

Still further, as shown in FIG. 4, the fundamental semiconductor memory of the invention is provided with a memory means 12 for storing information and a power supplying means 13 for supplying a power source to the memory means 12. The inventive constant voltage generator circuit 100 is connected to the power supplying means 13.

Operation of the fundamental constant voltage generator circuit of the invention will be described below. For example, as shown in FIG. 3, the fuse elements FU in a ROM fuse circuit 14 is programmed to generate the external control signal S, on the basis of which the bias variable means 11 has its output finely controlled. That is, connecting the common contacts Ck of the selection switching circuits Swk and contacts a, b, c, d, . . . selectively on the basis of the external control signal S causes the back-gate Bgn of the n transistors T1–Tn to be biased selectively with voltages supplied to the contact a, b, c, d, . . . —for example, voltages of source-drain connection points between transistors Tn and the voltage of the second power source line $V_{SS}$.

Accordingly, there is obtained a constant voltage $V_{DD}$ to which the ON-state resistance dependant on the threshold of Tn of the n transistors T1–Tn and the load resistor RL connected to the first power source line $V_{CC}$ proportionally allocate the voltage between the power source lines $V_{CC}$ and VSS. At this time, the threshold VTH of the n transistors T1–Tn varies in more fine steps as compared with the related art of the invention. This is because the voltage impressed on each back-gate Bgn of the transistors T1–Tn is biased with a selected strength of voltage.

Therefore, even when thresholds VTH of the transistors T1–Tn varies owing to unevenness in manufacturing, a constant voltage $V_{DD}$ adjusted by fine steps is supplied for each load circuit which requires a strict precision of the voltage. That is, the adjustment of the constant voltage is achieved with high precision.

Further, the operation of a fundamental semiconductor memory of the invention will be described below. For example, as shown in FIG. 4, the fuse elements FU of the ROM fuse circuit 14 are programmed to generate the said external control signal S, on the basis of which the bias voltages of the back-gates of the constant voltage generator circuit is minutely adjusted. Therefore, it is possible to supply constant voltages $V_{DDi}$ (i=1,2, . . . ,n), with precision, which is suitable for minutely-processed low-voltage-driven SRAM which has an extremely limited allowable of the operation voltage and the like.

Therefore, the optimum constant voltage $V_{DDi}$ is supplied for manufacture unevenness of transistors constituting the memory means 12. This contributes greatly to the manufacturing of semiconductor memory of high reliability such as low-voltage-driven SRAM's.

Next, we discuss illustrative embodiments of the present invention referring to the drawings.

(1) Constant Voltage Generator Circuit

Figure 5:
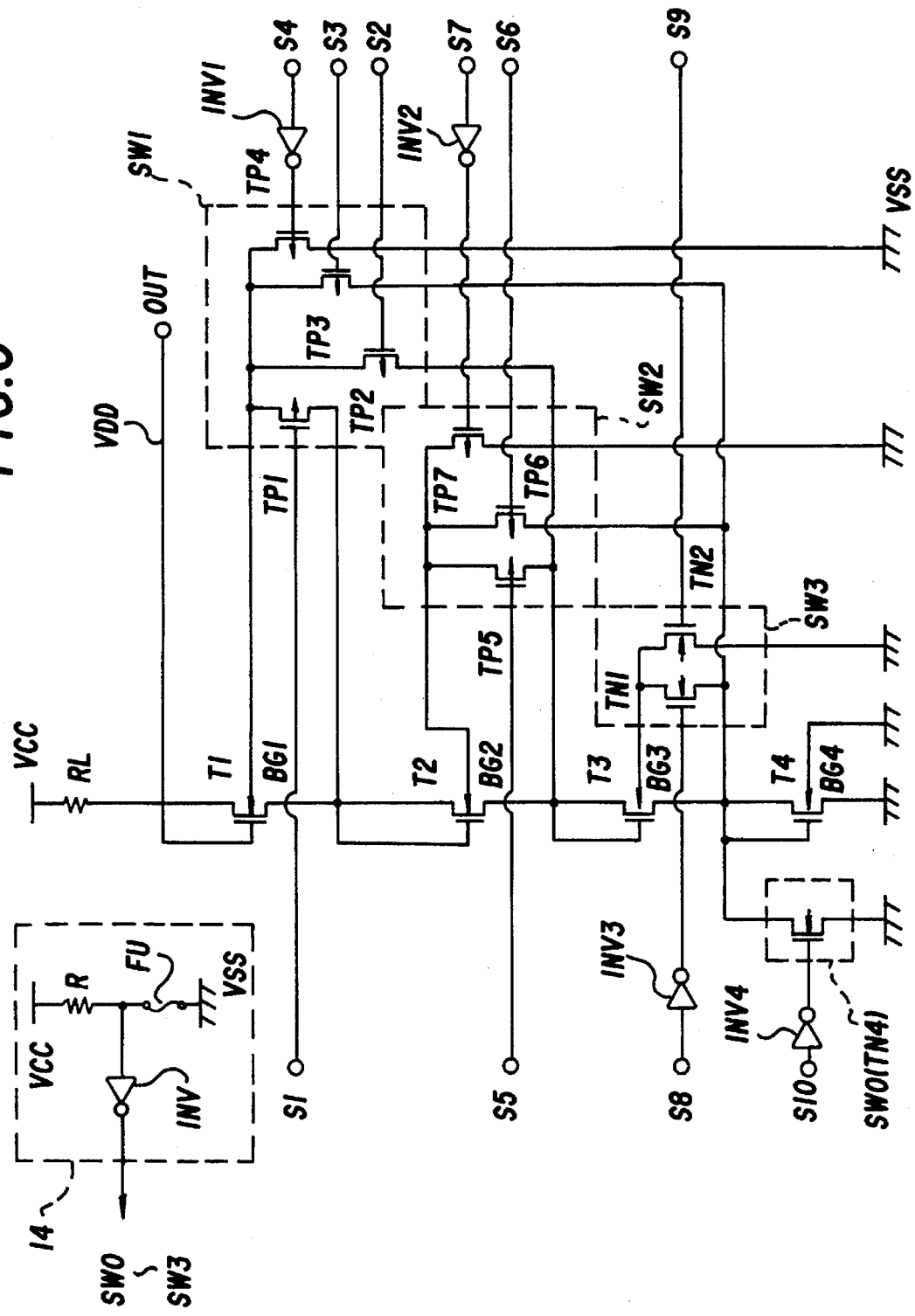
FIG. 5 is a diagram showing the arrangement of a constant voltage generator circuit according to a preferred embodiment of the present invention.

For example, as shown in FIG. 5, a constant voltage generator circuit for supplying a constant voltage to a load circuit which requires a strict precision of the power source voltage comprises transistors T1–T4, a load resistor RL, a switching element SW0, selection switching circuits SW1–SW3, inverter INV1–INV4, and a ROM fuse circuit 14.

That is, the transistors T1–T4 are one example set of n transistors T1–Tn, indicating the case of n=4. The four transistors T1–T4 are composed of n-type field effect transistors. Each of the transistors T1–T4 has its gate connected to its drain (hereinafter, referred to as "is diode-configured"). Also, the four transistors T1–T4 are connected in a series (source-drain connection). One end of the transistor T1 and one end of the load resistor RL are connected together to the output OUT. And, the source and the back-gate of the transistor T4 are connected to the second power source line (hereinafter, referred to as "the ground line") $V_{SS}$.

The load resistor RL, which is an example of the load element RL, has its one end connected to the first power source line (hereinafter, simply referred to as "the power source line") $V_{CC}$ of about 3V. As the load resistor RL, one or more transistor with less current-driving capability than the transistors T1–T4 are used.

The switching element SW0 and selection switching circuit SW1–SW3 are an illustrative example of a bias variable means 11, and the switching element SW0 is an example of the switching element 11A. The selection switching circuits SW1–SW3 are one example of k pieces of selection switching circuits Swk, indicating the case of k=3.

The switching element SW0 is composed of an n-type field effect transistor. The transistor TN4 has its source connected to the ground line $V_{SS}$, its drain connected to the source-drain connection of the transistors T3 and T4, and its gate connected to the ROM fuse circuit 14 via the inverter INV4.

The selection switching circuit SW1 is composed of 4 pieces of p-type field effect transistors TP1–TP4. The sources of the transistors TP1–TP4 are connected together to the back-gate BG1 of the transistor T1. The drain of the transistor TP1 is connected to the source-drain connection point of the transistors T1 and T2, and its gate is connected to the ROM fuse circuit 14. The drain of the transistor TP2 is connected to the source-drain connection point of the transistors T2 and T3, and its gate is connected to the ROM fuse circuit 14. The drain of the transistor TP3 is connected to the source-drain connection point of the transistors T3 and T4, and its gate is connected to the ROM fuse circuit 14. The drain of the transistor TP4 is connected to the ground line $V_{SS}$ and its gate is connected to the ROM fuse circuit 14.

The selection switching circuit SW2 is composed of 3 pieces of p-type field effect transistors TP5–TP7. The sources of the transistors TP5–TP7 are connected together to the back-gate BG2 of the transistor T2. The drain of the transistor TP5 is connected to the source-drain connection point of the transistors T2 and T3, and its gate is connected to the ROM fuse circuit 14. The drain of the transistor TP6 is connected to the source-drain connection point of the transistors T3 and T4, and its gate is connected to the ROM fuse circuit 14. The drain of the transistor TP7 is connected to the ground line $V_{SS}$ and its gate is connected to the ROM fuse circuit 14 via the inverter INV2.

The selection switching circuit SW3 is composed of 2 pieces of n-type field effect transistors TN1 and TN2. The drains of the transistors TN1 and TN2 are connected together to the back-gate BG3 of the transistor T3. The source of the transistor TN1 is connected to the source-drain connection point of the transistors T3 and T4, and its gate is connected to the ROM fuse circuit 14 via the inverter INV3. The source of the transistor TN2 is connected to the ground line $V_{SS}$ and its gate is connected to the ROM fuse circuit 14.

Specifically, one circuit worth of the ROM fuse circuit 14 for generating the external control signal S is composed of an inverter INV, a resistor R and a fuse FU. The resistor R and the fuse element FU is connected in a series between the power source line $V_{CC}$ and the ground line $V_{SS}$ and an inverter INV is connected to the serial connection point. The output of the inverter INV plays a role of the external control signal Si (i=1, . . . ,10) and is supplied to the switching element SW0 and the selection switching circuit SW1–SW3. According to the external control signals S1–S10, the bias voltages are controlled.

Figure 6:
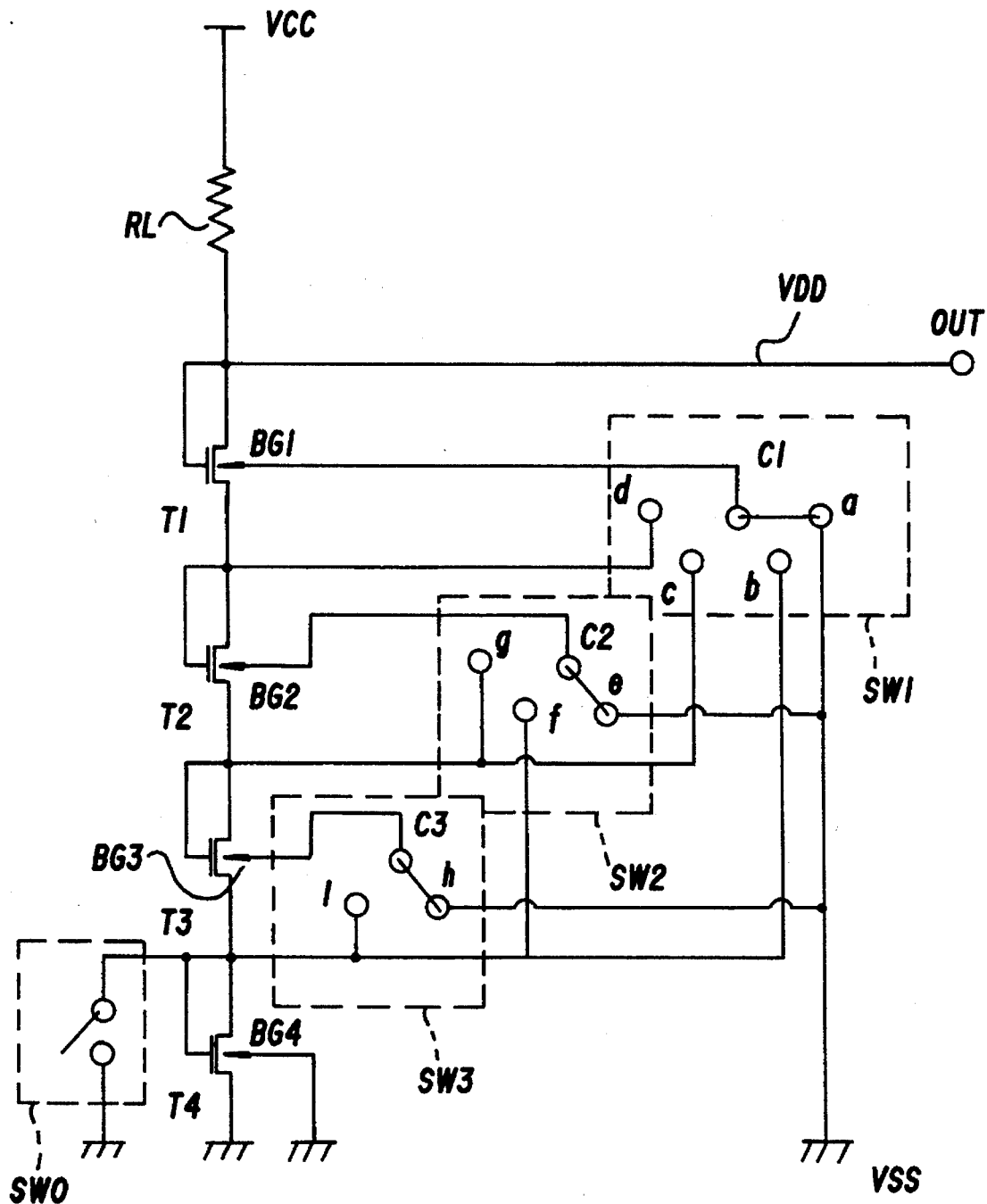
FIG. 6 shows an equivalent circuit of the constant voltage generator circuit shown in FIG. 5.

FIG. 6 shows an equivalent circuit of a constant voltage generator circuit according to an illustrative embodiment of the invention. As shown in FIG. 6, the selection switching circuit SW1 of the constant voltage generator circuit is replaced by a common contact C1 and contacts "a", "b", "c" and "d".

That is, the common contact C1 is a source-connection point of the transistors TP1–TP4 and is connected to the back-gate BG1 of the transistor T1. The contact "a" is the drain-connection point of the transistor TP4 and is connected to the ground line $V_{SS}$. The contact "b" is the drain-connection point of the transistor TP3 and is connected to the source-drain connection point of the transistor T3 and T4. The contact "c" is the drain-connection point of the transistor TP2 and is connected to the source-drain connection point of the transistor T2 and T3. The contact "d" is the drain-connection point of the transistor TP1 and is connected to the source-drain connection point of the transistor T1 and T2.

Also, the selection switching circuit SW2 is replaced by a common contact C2 and contacts "e", "f" and "g". That is, the common contact C2 is a source-connection point of the transistors TP5–TP7 and is connected to the back-gate BG2 of the transistor T2. The contact "e" is the drain-connection point of the transistor TP7 and is connected to the ground line $V_{SS}$. The contact "f" is the drain-connection point of the transistor TP6 and is connected to the source-drain connection point of the transistor T3 and T4. The contact "g" is the drain-connection point of the transistor TP5 and is connected to the source-drain connection point of the transistor T2 and T3.

Further, the selection switching circuit SW3 is replaced by a common contact C3 and contacts "h" and "i". That is, the common contact C3 is a drain-connection point of the transistors TN1–TN2 and is connected to the back-gate BG3 of the transistor T3. The contact "h" is the source-connection point of the transistor TN2 and is connected to the ground line $V_{SS}$. The contact "i" is the source-connection point of the transistor TN1 and is connected to the source-drain connection point of the transistor T3 and T4.

Further, the switching element SW0 is a equivalent circuit of the transistor TN4 and is connected in parallel to the transistor T4. The equivalent circuits of the switching element and the selection switching circuit SW1–SW3 are formed as described above.

Next, referring to supplementary equivalent circuits, we discuss the operation at the time of programming of a constant voltage generator circuit according to the embodiment of the invention.

As an example, we discuss the case of programming the fuse elements of a ROM fuse circuit 14 for generating external control signals S1–S10, under the operating condition that the power source line $V_{CC}$=3V, each threshold VTH of the four transistors T1–T4 equals 0.4V when the back-gate voltage=0 and the VTH becomes higher by about 0.1V as the back-gate voltage drops by 0.4 V. In other words, VTH becomes lower by approximately 0.1V as the back-gate voltage increases by 0.4V. VTH increases by approximately 0.1V as gate voltage increases by 0.4V.

Figure 7A:
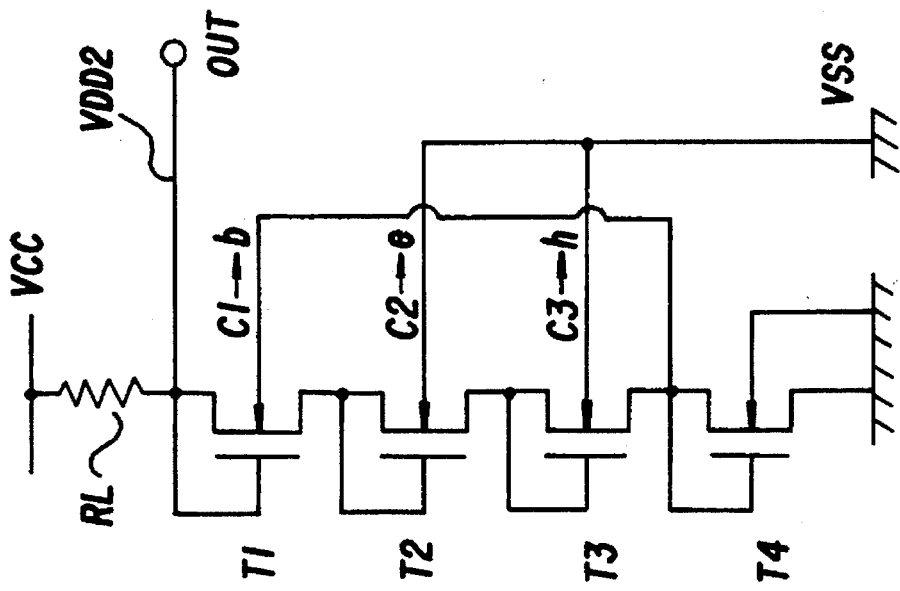
FIG. 7A through 7G each shows an equivalent circuit of the constant voltage generator circuit shown in FIG. 6 when programming (SW0=OFF)

For example, as shown in FIG. 7A, in case of providing the constant voltage $V_{DD1}$=2.2V, the switching element SW0 is operated in the OFF state (hereinafter referred to as "OFF") and the common contact C1 of the selection switching circuit SW1 is connected to the contact "a" (hereinafter simply expressed as "C1→a"). Further, the common contact C2 of the selection switching circuit SW2 is connected to the contact "e" and the common contact C3 of the selection switching circuit SW3 is connected to the contact "h". To be concrete, the fuse elements FU of the ROM fuse circuit 14 are melted and disconnected to generate the external control signals S4, S7 and S9, which are supplied to each gate of the transistor TP4 in the selection switching circuit SW1, the transistor TP7 in the selection switching circuit SW2 and the transistor TN2 in the selection switching circuit SW3, respectively.

Thus, at the output OUT there is generated a constant voltage $V_{DD1}$=2.2V, that is, the sum of 0.7V of the transistor T1 threshold VTH, 0.6V of the transistor T2 threshold VTH, 0.5V of the transistor T3 threshold VTH and 0.4V of the transistor T4 threshold VTH. The theoretical gate Voltage of transistor T4 is almost 0.4V, that of transistor T3 is almost 0.8V, that of transistor T2 is almost 1.2V, and that of transistor T1 is almost 1.6V. Therefore, VTH of transistor T3 increases by 0.1V and becomes 0.5V. Similarly, VTH of transistor T2 becomes 0.6V, and VTH of transistor T1 becomes 0.7V.

Figure 7B:
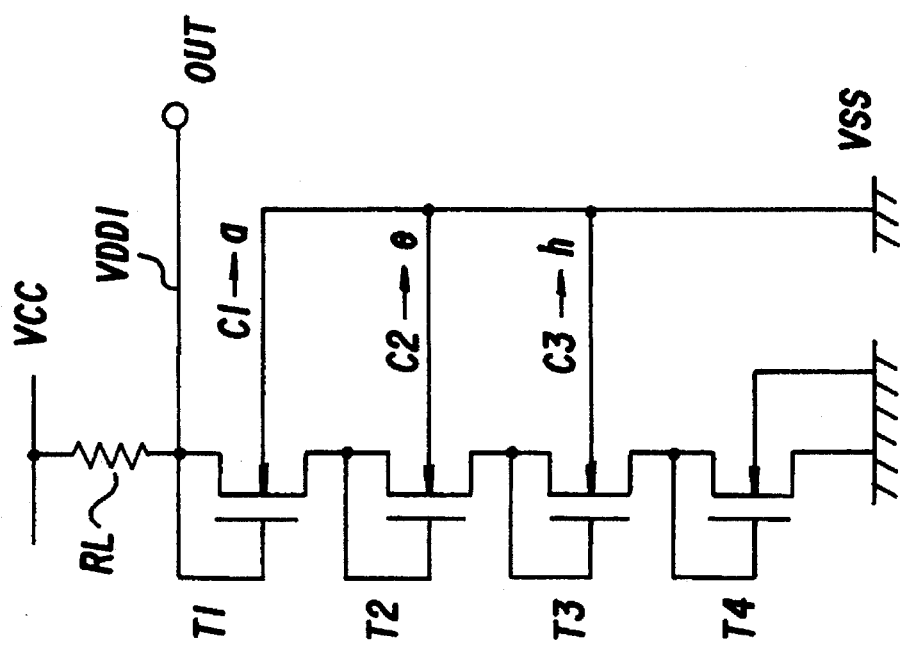

As shown in FIG. 7B, in case of providing the constant voltage $V_{DD2}$=2.1V, the connections are so made that SW0="OFF", C1→b at SW1, C2→e at SW2 and C3→h at SW3. To be concrete, the external control signals S3, S7 and S9 are generated in the ROM fuse circuit 14 and are supplied to each gate of the transistor TP3 in SW1, the transistor TP7 in SW2 and the transistor TN2 in SW3, respectively. The back gate of transistor T1 is connected to the source-drain connecting point of transistors T3 and T4, as shown in FIG. 7B. Therefore, the back-gate voltage of transistor T1 becomes 0.4V, thereby reducing VTH of transistor T1 by 0.1V. As a result, VTH of transistor T1 becomes 0.6V.

Thus, at the output OUT there is generated a constant voltage $V_{DD2}$=2.1V, that is, the sum of 0.6V of the transistor T1 threshold VTH, 0.6V of the transistor T2 threshold VTH, 0.5V of the transistor T3 threshold VTH and 0.4V of the transistor T4 threshold VTH.

Figure 7D:
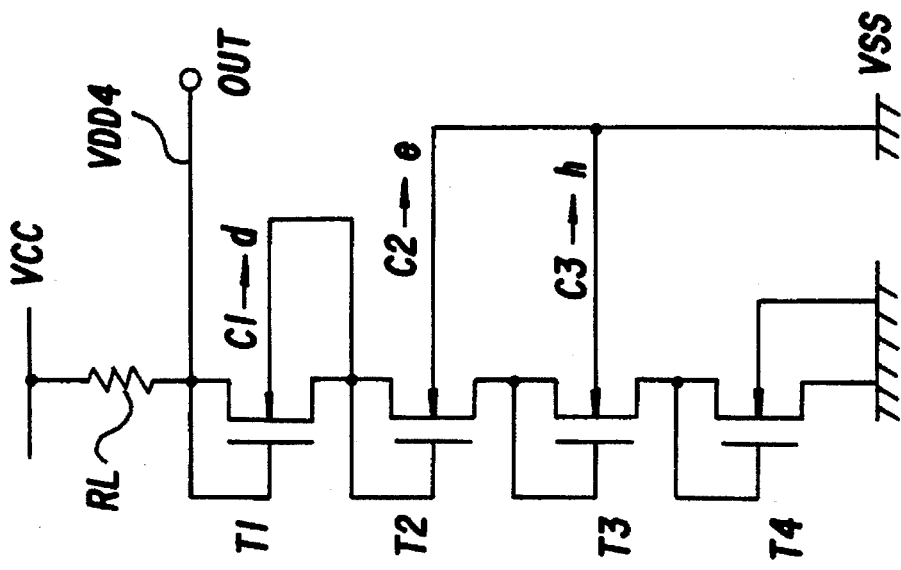
Figure 7C:
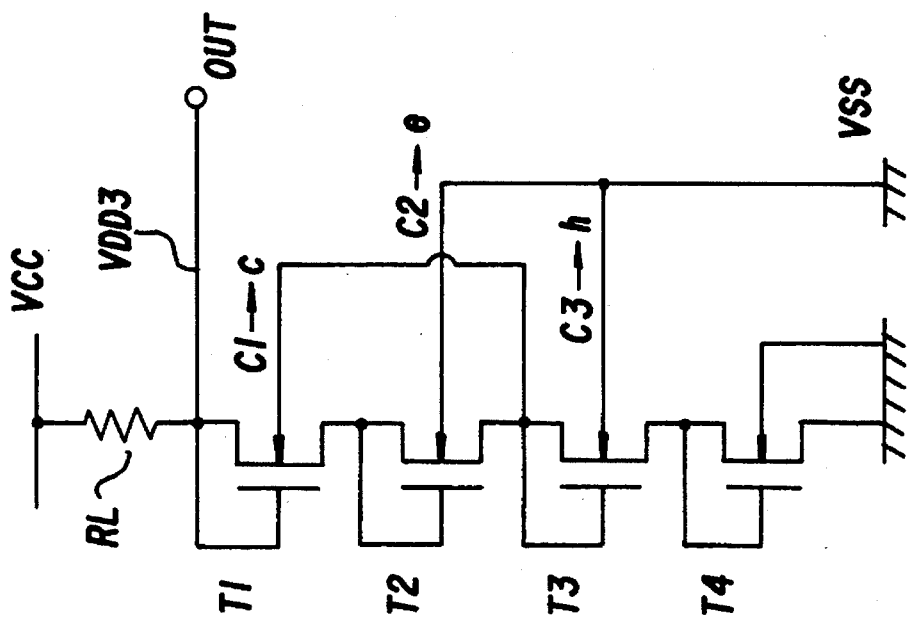

Further, as shown in FIG. 7C, in case of providing the constant voltage $V_{DD3}$=2.0V, the connections are so made that SW0="OFF", C1→c at SW1, C2→e at SW2 and C3→h at SW3. To be concrete, the external control signals S2, S7 and S9 are generated in the ROM fuse circuit 14 and are supplied to each gate of the transistor TP2 in SW1, the transistor TP7 in SW2 and the transistor TN2 in SW3, respectively. The back gate of transistor T1 is connected to the source-drain connecting point of transistors T2 and T3. Therefore, the back gate voltage of transistor T1 becomes 0.8V, thereby reducing VTH of transistor T1 by 0.2V. As a result, VTH of transistor T1 becomes 0.5V.

Thus, at the output OUT there is generated a constant voltage $V_{DD3}$=2.0 V, that is, the sum of 0.5V of the transistor T1 threshold VTH, 0.6V of the transistor T2 threshold VTH, 0.5V of the transistor T3 threshold VTH and 0.4V of the transistor T4 threshold VTH.

Further, as shown in FIG. 7D, in case of providing the constant voltage $V_{DD4}$=1.9 V, the connections are so made that SW0="OFF", C1→d at SW1, C2→e at SW2 and C3→h at SW3. To be concrete, the external control signals S1, S7 and S9 are generated in the ROM fuse circuit 14 and are supplied to each gate of the transistor TP1 in SW1, the transistor TP7 in SW2 and the transistor TN2 in SW3, respectively.

Thus, at the output OUT there is generated a constant voltage $V_{DD4}$=1.9 V, that is, the sum of 0.4V of the transistor T1 threshold VTH, 0.6V of the transistor T2 threshold VTH, 0.5V of the transistor T3 threshold VTH and 0.4V of the transistor T4 threshold VTH.

Figure 7F:
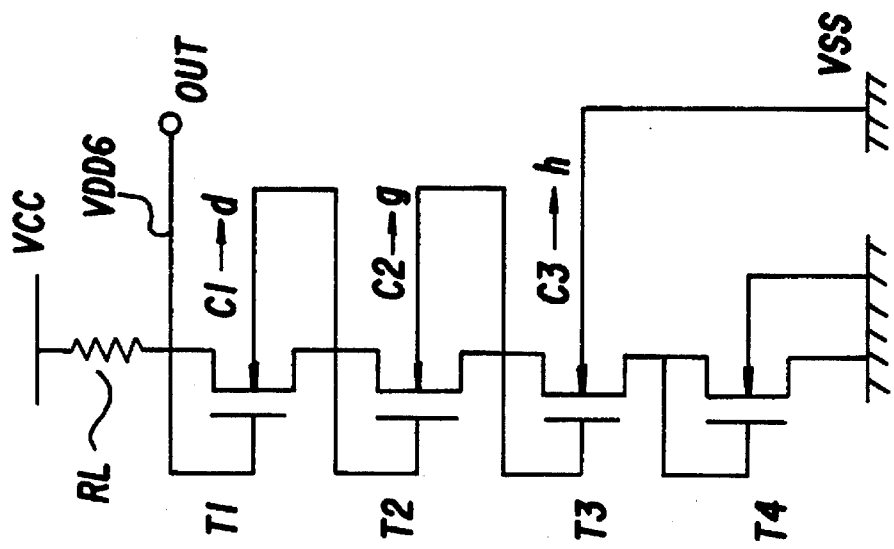
Figure 7E:
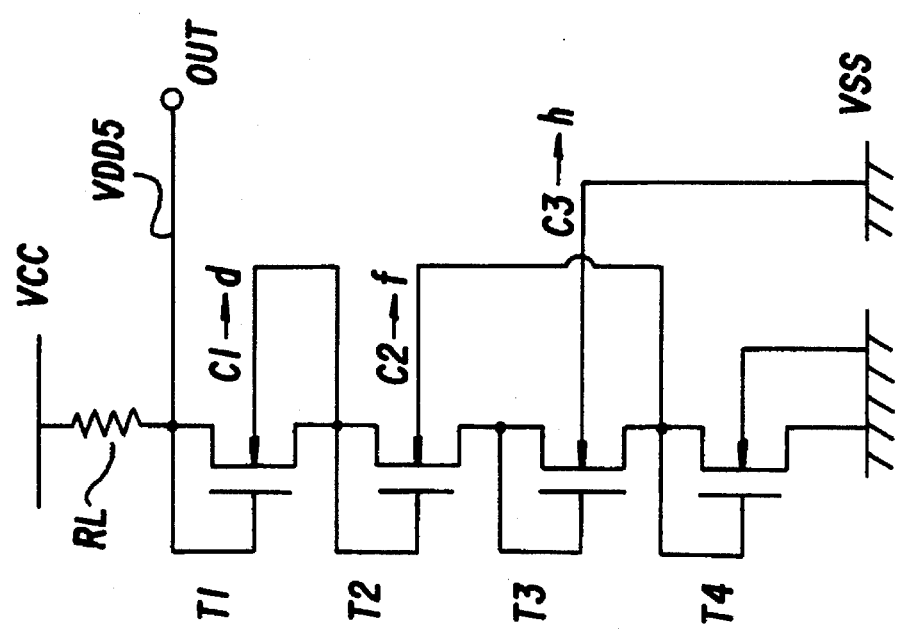

Similarly, as shown in FIG. 7E, in case of providing the constant voltage $V_{DD5}$=1.8 V, the connections are so made that SW0="OFF", C1→d at SW1, C2→f at SW2 and C3→h at SW3. To be concrete, the external control signals S1, S6 and S9 are generated in the ROM fuse circuit 14 and are supplied to each gate of the transistor TP1 in SW1, the transistor TP6 in SW2 and the transistor TN2 in SW3, respectively.

Thus, at the output OUT there is generated a constant voltage $V_{DD5}$=1.8V, that is, the sum of 0.4V of the transistor T1 threshold VTH, 0.5V of the transistor T2 threshold VTH, 0.5V of the transistor T3 threshold VTH and 0.4V of the transistor T4 threshold VTH.

Further, as shown in FIG. 7F, in case of providing the constant voltage $V_{DD6}$=1.7 V, the connections are so made that SW0="OFF", C1→d at SW1, C2→G at SW2 and C3→h at SW3. To be concrete, the external control signals S1, S5 and S9 are generated in the ROM fuse circuit 14 and are supplied to each gate of the transistor TP1 in SW1, the transistor TP5 in SW2 and the transistor TN2 in SW3, respectively.

Thus, at the output OUT there is generated a constant voltage $V_{DD6}$=1.7 V, that is, the sum of 0.4V of the transistor T1 threshold VTH, 0.4V of the transistor T2 threshold VTH, 0.5V of the transistor T3 threshold VTH and 0.4V of the transistor T4 threshold VTH.

Figure 7G:
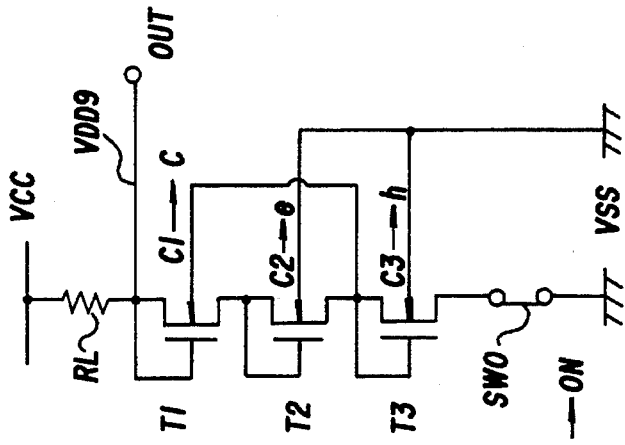

Further, as shown in FIG. 7G, in case of providing the constant voltage $V_{DD7}$=1.6V, the connections are so made that SW0="OFF", C1→d at SW1, C2→G at SW2 and C3→i at SW3. To be concrete, the external control signals S1, S5 and S8 are generated in the ROM fuse circuit 14 and are supplied to each gate of the transistor TP1 in SW1, the transistor TP5 in SW2 and the transistor TN1 in SW3, respectively.

Thus, at the output OUT there is generated a constant voltage $V_{DD7}$=1.6V, that is, the sum of 0.4V of the transistor T1 threshold VTH, 0.4V of the transistor T2 threshold VTH, 0.4V of the transistor T3 threshold VTH and 0.4V of the transistor T4 threshold VTH.

Figure 8A:
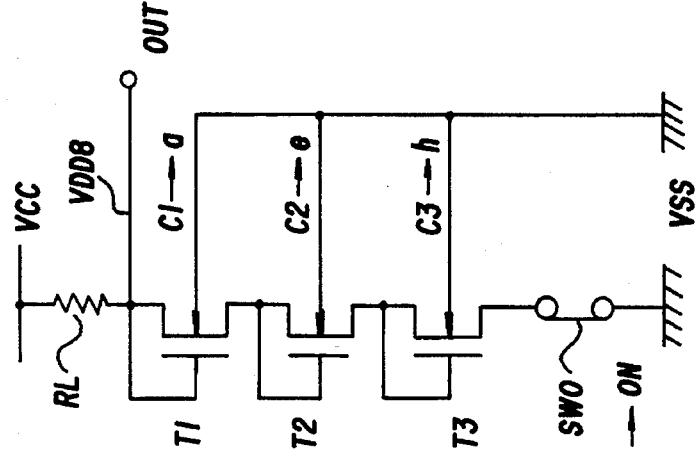
FIG. 8A through 8D each shows an equivalent circuit of the constant voltage generator circuit shown in FIG. 6 when programming (SW0=ON)

Still further, as shown in FIG. 8A, in case of providing the constant voltage $V_{DD8}=1.5V$, the connections are so made that SW0="ON" C1→a at SW1 C2→e at SW2 and C3→h at SW3. To be concrete, the external control signals S4, S7 and S9 are generated in the ROM fuse circuit 14 and are supplied to each gate of the transistor TP4 in SW1, the transistor TP7 in SW2 and the transistor TN2 in SW3, respectively.

Thus, at the output OUT there is generated a constant voltage $V_{DD8}=1.5V$, that is, the sum of 0.6V of the transistor T1 threshold VTH, 0.5V of the transistor T2 threshold VTH and 0.4V of the transistor T3 threshold VTH.

Figure 8B:
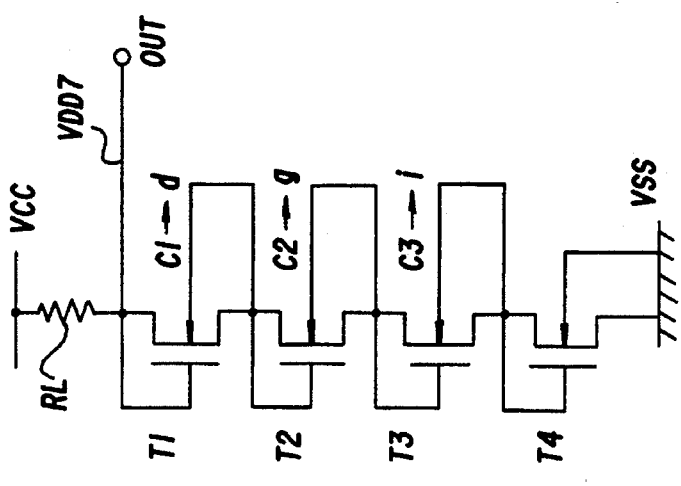

Similarly, as shown in FIG. 8B, in case of providing the constant voltage $V_{DD9}=1.4V$, the connections are so made that SW0="ON", C1→c at SW1, C2→e at SW2 and C3→h at SW3. To be concrete, the external control signals S10, S2, S7 and S9 are generated in the ROM fuse circuit 14 and are supplied to each gate of the transistor TN4 in SW0, the transistor TP2 in SW1, the transistor TP7 in SW2 and the transistor TN2 in SW3, respectively.

Thus, at the output OUT there is generated a constant voltage $V_{DD9}=1.4V$, that is, the sum of 0.5V of the transistor T1 threshold VTH, 0.5V of the transistor T2 threshold VTH and 0.4V of the transistor T3 threshold VTH.

Figure 8C:
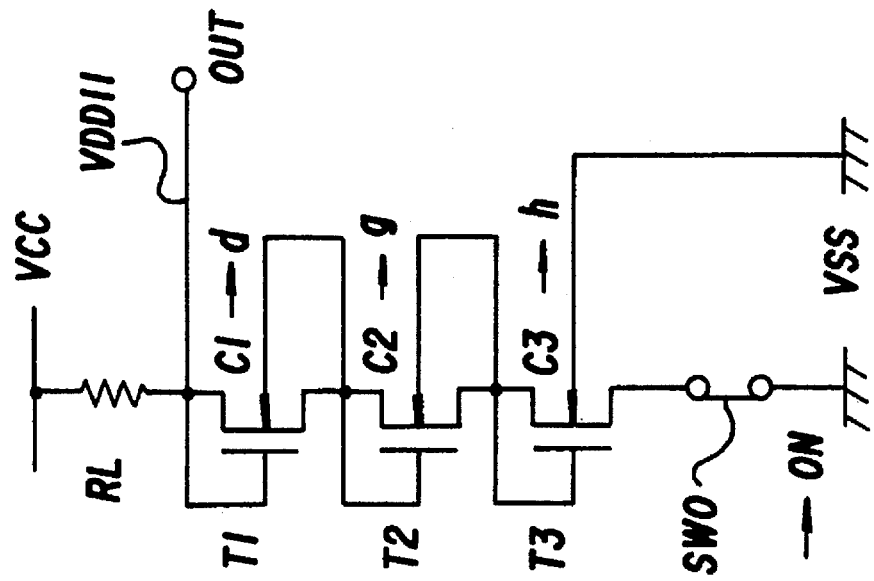

Further, as shown in FIG. 8C, in case of providing the constant voltage $V_{DD10}=1.3V$, the connections are so made that SW0="ON" C1→d at SW1, C2→e at SW2 and C3→h at SW3. To be concrete, the external control signals S1, S7 and S9 are generated in the ROM fuse circuit 14 and are supplied to each gate of the transistor TP4 in SW1, the transistor TP7 in SW2 and the transistor TN2 in SW3, respectively.

Thus, at the output OUT there is generated a constant voltage $V_{DD10}=1.3V$, that is, the sum of 0.4V of the transistor T1 threshold VTH, 0.5V of the transistor T2 threshold VTH and 0.4V of the transistor T3 threshold VTH.

Figure 8D:
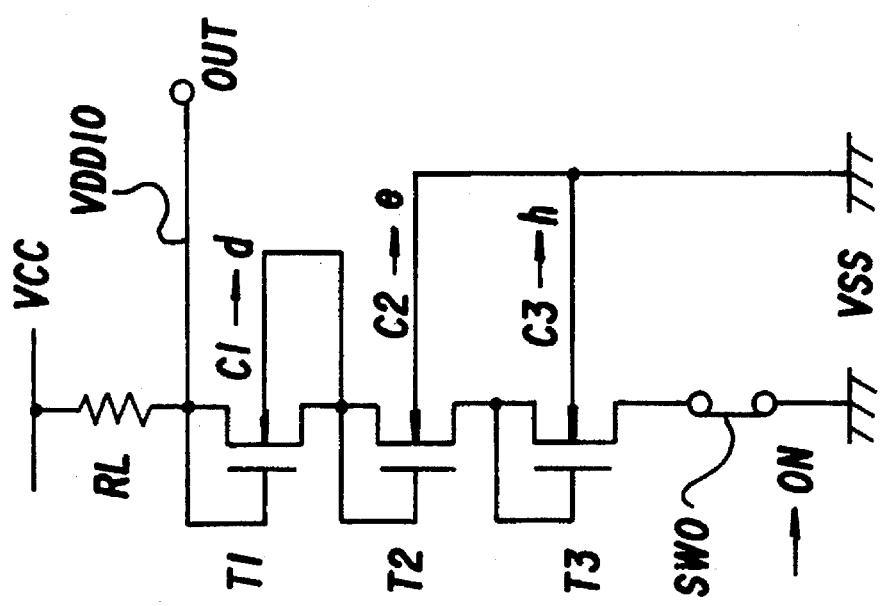

Further, as shown in FIG. 8D, in case of providing the constant voltage $V_{DD11}=1.2V$, the connections are so made that SW0="ON", C1→d at SW1, C2→g at SW2 and C3→h at SW3. To be concrete, the external control signals S1, S5 and S9 are generated in the ROM fuse circuit 14 and are supplied to each gate of the transistor TP4 in SW1, the transistor TP7 in SW2 and the transistor TN2 in SW3, respectively.

Thus, at the output OUT there is generated a constant voltage $V_{DD12}=1.2V$, that is, the sum of 0.4V of the transistor T1 threshold VTH, 0.4V of the transistor T2 threshold VTH and 0.4V of the transistor T3 threshold VTH.

In Table 1, the relations among the state of the switches, the thresholds VTH of each transistor, and constant (output) voltage are summarized.

TABLE 1

| SWITCHES | | | | TRANSISTOR VTH [V] | | | | VOLTAGE VDDi [V] |
|---|---|---|---|---|---|---|---|---|
| SW 1 | SW 2 | SW 3 | SW 0 | T1 | T2 | T3 | T4 | T1 + T2 + T3 + T4 |
| a | e | h | OFF | 0.7 | 0.6 | 0.5 | 0.4 | 2.2 |
| b | ↑ | ↑ | | 0.6 | ↑ | ↑ | ↑ | 2.1 |
| c | ↑ | ↑ | | 0.5 | ↑ | ↑ | ↑ | 2.0 |
| d | ↑ | ↑ | | 0.4 | ↑ | ↑ | ↑ | 1.9 |
| a | f | ↑ | ↑ | 0.7 | 0.5 | ↑ | ↑ | 2.1 |
| b | ↑ | ↑ | | 0.6 | ↑ | ↑ | ↑ | 2.0 |
| c | ↑ | ↑ | | 0.5 | ↑ | ↑ | ↑ | 1.9 |
| d | ↑ | ↑ | | 0.4 | ↑ | ↑ | ↑ | 1.8 |

TABLE 1-continued

| SWITCHES | | | | TRANSISTOR VTH [V] | | | | VOLTAGE VDDi [V] |
|---|---|---|---|---|---|---|---|---|
| SW 1 | SW 2 | SW 3 | SW 0 | T1 | T2 | T3 | T4 | T1 + T2 + T3 + T4 |
| a | g | ↑ | ↑ | 0.7 | 0.4 | ↑ | ↑ | 2.0 |
| b | ↑ | ↑ | | 0.6 | ↑ | ↑ | ↑ | 1.9 |
| c | ↑ | ↑ | | 0.5 | ↑ | ↑ | ↑ | 1.8 |
| d | ↑ | ↑ | | 0.4 | ↑ | ↑ | ↑ | 1.7 |
| a | e | i | ↑ | 0.7 | 0.6 | 0.4 | ↑ | 2.1 |
| b | ↑ | ↑ | | 0.6 | ↑ | ↑ | ↑ | 2.0 |
| c | ↑ | ↑ | | 0.5 | ↑ | ↑ | ↑ | 1.9 |
| d | ↑ | ↑ | | 0.4 | ↑ | ↑ | ↑ | 1.8 |
| a | f | ↑ | ↑ | 0.7 | 0.5 | ↑ | ↑ | 2.0 |
| b | ↑ | ↑ | | 0.6 | ↑ | ↑ | ↑ | 1.9 |
| c | ↑ | ↑ | | 0.5 | ↑ | ↑ | ↑ | 1.8 |
| d | ↑ | ↑ | | 0.4 | ↑ | ↑ | ↑ | 1.7 |
| a | g | ↑ | ↑ | 0.7 | 0.4 | ↑ | ↑ | 1.9 |
| b | ↑ | ↑ | | 0.6 | ↑ | ↑ | ↑ | 1.8 |
| c | ↑ | ↑ | | 0.5 | ↑ | ↑ | ↑ | 1.7 |
| d | ↑ | ↑ | | 0.4 | ↑ | ↑ | ↑ | 1.6 |
| a | g | h | ON | 0.6 | 0.5 | 0.4 | — | 1.5 |
| c | ↑ | ↑ | | 0.5 | ↑ | ↑ | — | 1.4 |
| d | ↑ | ↑ | | 0.4 | ↑ | ↑ | — | 1.3 |
| a | g | h | ↑ | 0.6 | 0.4 | ↑ | — | 1.4 |
| c | ↑ | ↑ | | 0.5 | ↑ | ↑ | — | 1.3 |
| d | ↑ | ↑ | | 0.4 | ↑ | ↑ | — | 1.2 |

NOTE
↑: SAME AS ABOVE

As shown in Table 1, though some values of the constant voltages $V_{DDi}$ are repeated, the constant voltages $V_{DDi}$ is adjusted by the step of 0.1V as described above. See the parts enclosed with meshes in Table 1.

In this way, in a constant voltage generator circuit according to an illustrative embodiment of the invention, as shown in FIG. 5, being provided with a load resistor RL, a switching element SW0, selection switching circuit SW1–SW3, four transistors T1–T4 and a ROM fuse circuit 14, the switching element SW0 and the selection switching circuit SW1–SW3 have their output controlled on the basis of the external control signals S1–S10.

For this reason, programming the ROM fuse circuit 14 enables very fine control of the outputs of the selection switching circuit SW1–SW3 as shown in Table 1. That is, by connecting the common contact C1 and the other contact a, b, c and d of the selection switching circuit SW1 selectively on the basis of the external control signals S1-S4, connecting the common contact C2 and the other contact e, f and g of the selection switching circuit SW2 selectively on the basis of the external control signals S5–S7, and connecting the common contact C3 and the other contact h and i of the selection switching circuit SW3 selectively on the basis of the external control signals S8 and S9. It is possible to bias the back-gates of the transistors T1–T4 with the voltages supplied to the contact "a" through "i" —for example, the voltages of the source-drain connection points between the transistors T1 and T2, T2 and T3, and T3 and T4, and the voltage of the power source line $V_{SS}$.

Therefore, it is possible to provide the constant voltage $V_{DD1}=2.2V$ through $V_{DD11}=1.2V$ to which the voltage between the power source line $V_{CC}$ and the ground line $V_{SS}$ is proportionally allotted by the ON-state resistance dependent on the thresholds of the transistors T1–T4 and the load resister RL connected to the power source line $V_{CC}$. In this operation, the thresholds of the transistors T1–T4 is changed through biasing by the step of 0.1 V, which is finer as compared with related arts. This is due to the voltages selectively supplied to the back-gates BG1–BG4 of the transistors T1–T4.

Accordingly, an optimal adjustment adapted for the load circuit is possible like constant voltages $V_{DDi}$ shown in Table 1, even when the thresholds VTH varies because of manufacturing unevenness of the transistors T1–T4. Further, the adjustment of a constant voltage $V_{DDi}$ is achieved with high precision.

(2) A Preferred Application Circuit of a Constant Voltage Generator Circuit

Figure 9:
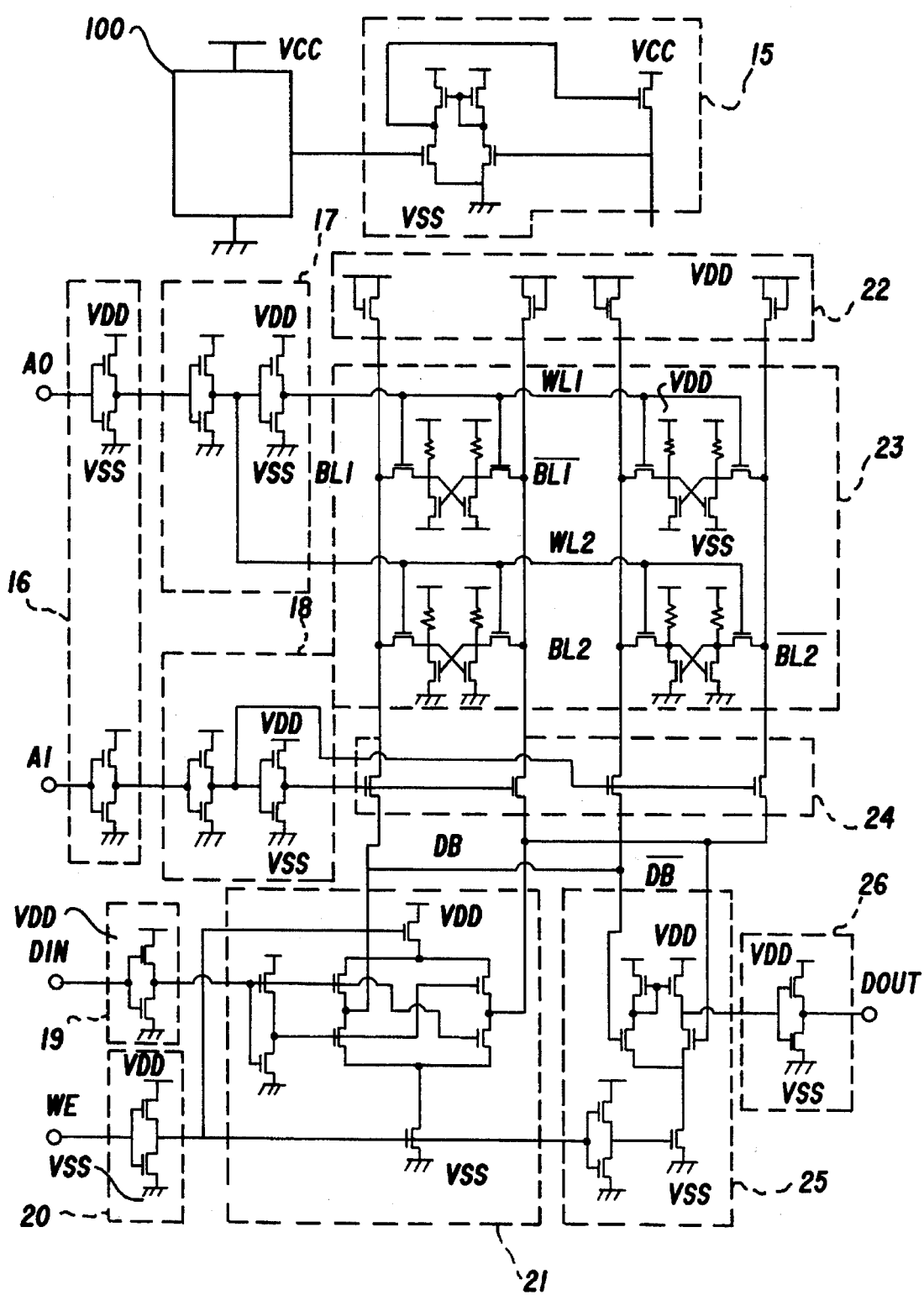
FIG. 9 is a diagram showing the arrangement of a static random access memory (SRAM) in which a constant voltage generator circuit according to an embodiment of the invention is utilized.

For example, as shown in FIG. 9, a static random access memory (SRAM) for storing 4-bit data which is an example of semiconductor memory comprises a constant voltage generator circuit 100, an internal power generator 15, an address buffer 16, a row decoder 17, a column decoder 18, an input buffer 19, a WE buffer 20, a write amplifier 21, a bit line load 22, a column transfer 23, a cell array 24, a sense amplifier 25, and an output buffer 26 (hereinafter, referred to as "main parts 16 through 26").

That is, the constant voltage generator circuit 100 and the internal power generator 15 form an example of a power supplying means 13, and SRAM main parts 16 through 26 form a memory means 12. The constant voltage generator circuit supplies constant voltage to SRAM main parts 16 through 26. Here, the constant voltage generator circuit 100 is characterized in that it comprises a constant voltage generator circuit according to an embodiment of the invention.

The address buffer 16 inverts and supplies address A0 and A1 to the row decoder 17 and the column decoder 18, respectively. The row decoder 17 selects one out of word lines WL1 and WL2 of the cell array 23. The column decoder 18 generates signals for selecting among bit lines BL1, B12, $\overline{BL1}$ and $\overline{BL2}$ of the cell array 23.

The input buffer 19 inverts and supplies a write data DIN to the write amplifier 21. The WE buffer 20 inverts and supplies write/read enable signal $\overline{WE}$ to the write amplifier 21. The write amplifier 21 amplifies a write data DIN according to the enable signal WE and write it to the cell array 23. And, bit line load 22 supplies a constant voltage to the bit line BL1×2, BL2×2.

The column transfer 23 selects among bit lines BL1, B12, $\overline{BL1}$ and $\overline{BL2}$. The cell array 24 stores write data DIN. The sense amplifier 25 amplifies and outputs read data DB and $\overline{DB}$. The output buffer 26 inverts data DB and outputs them outside as output data DOUT.

The operation of the SRAM will be described below. For example in the write operation, when address A0, A1 is specified for write data DIN, the address signal A0 is inverted and supplied to the row decoder 17 and similarly the address A1 is inverted and supplied to the column decoder 18. Further, either word line WL1 or WL2 of the cell array 23 is selected in the row decoder 17. The selection among bit lines BL1, B12, $\overline{BL1}$ and $\overline{BL2}$ of the cell array 23 is made by the column decoder 18 and the column transfer 24. Then, write data DIN is inverted and supplied by the input buffer 19 to the write amplifier 21, where it is amplified on the basis of the write/read enable signal WE to be written into the cell of the cell array 23 which is specified by the address A0, A1.

In read operation, when address A0, A1 is specified for read data DB, the address signals A0 and A1 are inverted by the address buffer 16 to be supplied to the row decoder 17 and column decoder 18, respectively. Also, the row decoder 17 selects either word line WL1 or WL2 of the cell array 23, and the column decoder 18 makes selections among the bit lines BL1, BL2, $\overline{BL1}$ and $\overline{BL2}$. Then, read data DB, $\overline{DB}$ are amplified on the basis of the read/write enable signal WE by the sense amplifier 25 to be output outside from the output buffer 26 as an output data DOUT.

Thus, as shown in FIG. 8, according to the SRAM which utilizes a constant voltage generator circuit according to an embodiment of the invention, there are provided a constant voltage generator circuit 100, an internal power generator 15 and SRAM main parts 16 through 26. And a constant voltage generator circuit according to an illustrative embodiment of the invention is applied to the said constant voltage generator circuit 100.

Therefore, the output voltage of a constant voltage generator circuit is finely adjusted by means of bias control based on the external control signals S1–S10 which are generated by programming the fuse elements FU of a ROM fuse circuit 14. For this reason, an optimal constant voltage $V_{DDi}$ is supplied with precision to each transistor circuit of minutely-processed low-voltage-driven SRAM, that is, an address buffer 16, a row decoder 17, a column decoder 18, an input buffer 19, a WE buffer 20, a write amplifier 21, a bit line load 22, a column transfer 23, a cell array 24, a sense amplifier 25, and an output buffer 26.

This contributes greatly to an offer of reliable low-voltage-driven SRAM because an optimal power source voltage is provided for manufacturing unevenness of component transistors of SRAM main parts 16 through 26.

What is claimed is:

1. An output voltage generator circuit, comprising:

a transistor circuit for outputting an output voltage, said transistor circuit comprising a plurality of transistors connected in series, wherein a source of a first transistor of said plurality of transistors is connected to a drain of a second, transistor of said plurality of transistors, and wherein each of said transistors is connected in a diode configuration; and adjusting means connected to said transistor circuit, said adjusting means for separately adjusting a back-gate voltage of each transistor of said plurality of transistors, said adjusting means comprising switches connected to each of the plurality of transistors to selectively connect the backgate of said each transistor with a source of said each transistor or with a source of another transistor of said plurality of transistors which has a source voltage of at least one diode voltage threshold below the source of said each transistor, said back-gate voltages being controlled based upon control signals from an external source, wherein said transistor circuit outputs an output voltage based upon adjustments by said adjusting means.

2. An output voltage generator circuit as recited in claim 1, further comprising:

a load element for dividing a power source voltage with said plurality of transistors.

3. An output voltage generator circuit as recited in claim 1, further comprising:

a ROM fuse circuit for generating said control signals.

4. An output voltage generator circuit according to claim 2 or 3, wherein said adjusting means comprises:

(a) a plurality of switching circuits respectively connected to said plurality of transistors for supplying bias voltages individually to back-gates of each of the plurality of transistors in said transistor circuit, based upon the control signals; and (b) a switching element for stopping an operation of a transistor in said transistor circuit based upon the control signals.

5. An output voltage generator circuit according to claim 2 or 3, wherein a first switching circuit of said adjusting means, based upon the control signals, biases a back-gate of the first transistor in said transistor circuit with one voltage selected from a group of voltages including
- a source voltage between the first and second serially-connected transistors,
- a source voltage between the second transistor and third transistor of said plurality of transistors,
- a source voltage between the two adjacent transistors of said plurality of transistors, and
- a power source voltage.

6. An output voltage generator circuit according to claim 2 or 3, wherein a second switching circuit of said adjusting means, based upon the control signals, biases a back-gate of the second transistor in said transistor circuit with one voltage selected from a group of voltages including of
- a source voltage between the second transistor and third transistor of said plurality of transistors,
- a source voltage between the third transistor and a fourth transistor,
- a source voltage between two adjacent transistors of said plurality of transistors, and
- a power source voltage.

7. An output voltage generator circuit according to claim 2 or 3, wherein a switching circuit of said adjusting means, based upon the control signals, biases a back-gate of one transistor of said transistor circuit with a voltage selected from a group of voltages including of
- a source voltage between the one transistor and an adjacent transistor; and
- a power source voltage.

8. An output voltage generator circuit according to claim 3, wherein said control signal is generated by programming the fuse elements of said ROM fuse circuit.

9. An output voltage generator circuit according to claim 2 or 3, wherein said transistor circuit comprising n-type field effect transistors.

10. A semiconductor memory comprising:
(a) memory means for storing information; and
(b) output voltage generating means for supplying voltage to said memory means, said output voltage generating means including
   a transistor circuit for outputting said output voltage, said transistor circuit comprising a plurality of transistors connected in series, wherein a source of a first transistor of said plurality of transistors is connected to a drain of a second transistor of said plurality of transistors, and wherein each of said transistors is connected in a diode configuration; and
adjusting means connected to said transistor circuit, said adjusting meads for separately adjusting a back-gate voltage of each transistor of said plurality of transistors, said adjusting means comprising switches connected to each of the plurality of transistors to selectively connect the backgate of said each transistor with a source of said each transistor or with a source of another transistor of said plurality of transistors which has a source voltage of at least one diode voltage threshold below the source of said each transistor, said back-gate voltages being controlled based upon control signals from an external source,
wherein said transistor circuit outputs an output voltage based upon adjustments by said adjusting means.

11. A semiconductor memory according to claim 10, wherein said transistor circuit further comprises
   a load element for dividing a power source voltage with said plurality of transistors.

12. A semiconductor memory according to claim 10, wherein said output voltage generating means further comprises a ROM fuse circuit for generating said control signals.

* * * * *

UNITED STATES PATENT AND TRADEMARK OFFICE
CERTIFICATE OF CORRECTION

PATENT NO. : 5,473,277
DATED : December 5, 1995
INVENTOR(S) : FURUMOCHI

It is certified that error appears in the above-indentified patent and that said Letters Patent is hereby corrected as shown below:

In column 14, line 30, after "a second," delete --,--.

Signed and Sealed this

Sixteenth Day of April, 1996

Attest:

BRUCE LEHMAN

Attesting Officer

Commissioner of Patents and Trademarks